(12) United States Patent
Lim et al.

(10) Patent No.: US 12,193,258 B2
(45) Date of Patent: Jan. 7, 2025

(54) DISPLAY DEVICE INCLUDING A PROTECTION LAYER

(71) Applicant: SAMSUNG DISPLAY CO., LTD., Yongin-si (KR)

(72) Inventors: Sung Wook Lim, Uiwang-si (KR); Sung Tae Hwang, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 490 days.

(21) Appl. No.: 17/645,711

(22) Filed: Dec. 22, 2021

(65) Prior Publication Data

US 2023/0018834 A1 Jan. 19, 2023

(30) Foreign Application Priority Data

Jul. 14, 2021 (KR) .................. 10-2021-0092253

(51) Int. Cl.
*H10K 50/844* (2023.01)
*H10K 50/86* (2023.01)
*H10K 59/12* (2023.01)
*H10K 77/10* (2023.01)
*H10K 102/00* (2023.01)

(52) U.S. Cl.
CPC .......... *H10K 50/844* (2023.02); *H10K 50/86* (2023.02); *H10K 59/12* (2023.02); *H10K 77/111* (2023.02); *H10K 2102/311* (2023.02)

(58) Field of Classification Search
CPC ............ H10K 59/8793; H10K 77/111; H10K 2102/311; H10K 59/8722
See application file for complete search history.

(56) References Cited

U.S. PATENT DOCUMENTS

| 5,869,929 | A  | * | 2/1999  | Eida ................. | H10K 59/38 313/461 |
| 5,909,081 | A  | * | 6/1999  | Eida ................. | H10K 59/873 313/506 |
| 10,153,457 | B2 | * | 12/2018 | Son ................. | H10K 77/111 |
| 10,268,238 | B2 | * | 4/2019  | Hamburgen ......... | G06F 3/0412 |

(Continued)

FOREIGN PATENT DOCUMENTS

KR  10-2018-0120311  11/2018
KR  10-2019-00376  4/2019

(Continued)

*Primary Examiner* — Evren Seven
(74) *Attorney, Agent, or Firm* — F. CHAU & ASSOCIATES, LLC (57) ABSTRACT

A display device according to an embodiment of the present disclosure includes a display panel including a first region, a second region, and a bending part disposed therebetween. A protection layer is disposed on the bending part and a part of the first region adjacent to the bending part. A polarization layer is disposed on the first region and is separated from the protection layer. At least one adhesive layer is disposed on the polarization layer. The at least one adhesive layer includes a first portion overlapping the polarization layer, a second portion covering a part of the protection layer on the first region, and a third portion disposed between the first portion and the second portion and disposed on a separation space between the polarization layer and the protection layer.

24 Claims, 6 Drawing Sheets

(56) References Cited

U.S. PATENT DOCUMENTS

| | | | |
|---|---|---|---|
| 2012/0007106 A1* | 1/2012 | Jung | H10K 59/8791 |
| | | | 257/E51.018 |
| 2017/0047547 A1* | 2/2017 | Son | H10K 77/111 |
| 2017/0068128 A1* | 3/2017 | Lim | G02F 1/133512 |
| 2017/0194411 A1* | 7/2017 | Park | H10K 50/846 |
| 2017/0200915 A1* | 7/2017 | Lee | B32B 7/12 |
| 2018/0062090 A1* | 3/2018 | Kim | H10K 59/873 |
| 2018/0090696 A1* | 3/2018 | Jang | H10K 77/10 |
| 2018/0182829 A1* | 6/2018 | Shin | H10K 59/131 |
| 2018/0183001 A1* | 6/2018 | Lee | H10K 59/8791 |
| 2022/0011489 A1* | 1/2022 | Kim | G06F 1/1637 |
| 2023/0244020 A1* | 8/2023 | Yano | H10K 50/844 |
| | | | 359/483.01 |

FOREIGN PATENT DOCUMENTS

| | | |
|---|---|---|
| KR | 10-2019-0100564 | 8/2019 |
| KR | 10-2080011 | 2/2020 |

* cited by examiner

DISPLAY DEVICE INCLUDING A PROTECTION LAYER

CROSS-REFERENCE TO RELATED APPLICATION

This application claims priority to and the benefit of Korean Patent Application No. 10-2021-0092253 filed in the Korean Intellectual Property Office on Jul. 14, 2021, the entire contents of which are herein incorporated by reference.

TECHNICAL FIELD

The present disclosure relates to a display device and, more particularly, to a display device including a protection layer.

DISCUSSION OF THE RELATED ART

Bendable display panels, that are capable of being bent without cracking or otherwise breaking, are being developed. One use for such bendable display panels is to bend a non-display area of the display panel back behind the display area of the display panel so as to hide the non-display area from view, reduce the appearance of a bezel surrounding the display area, and make a device incorporating the display panel appear to be smaller and more appealing. In such arrangements, the region of the display panel that is bent may be referred to as a bending part.

In addition, since the display device itself is flexible, the display device may be bent in other ways and may be flexed, folded, rolled, stretched, etc. so as to achieve a desired shape or function.

SUMMARY

A display device includes a display panel including a first region, a second region, and a bending part disposed between the first region and the second region. A protection layer is disposed on the bending part and a part of the first region adjacent to the bending part. A polarization layer is disposed on the first region and is separated from the protection layer. At least one adhesive layer is disposed on the polarization layer. At least one adhesive layer includes a first portion overlapping the polarization layer, a second portion covering a part of the protection layer on the first region, and a third portion disposed between the first portion and the second portion and disposed on a separation space between the polarization layer and the protection layer.

The separation space may be blocked from an outside by at least one adhesive layer.

The first portion, the second portion, and the third portion may be continuously formed.

A cover window disposed on the polarization layer, and a first adhesive layer disposed between the cover window and the polarization layer, may be further included.

A protection film disposed on the cover window, and a second adhesive layer disposed between the protection film and the cover window, may be further included.

At least one adhesive layer may include the first adhesive layer and/or the second adhesive layer.

The protection layer may further include a portion disposed on a part of the second region adjacent to the bending part.

The protection layer may include a curing type of resin.

In a bending state, the first region and the second region may overlap and face each other.

The first region may include at least one deformation part that can be deformed.

A display device includes a display panel including a first region, a second region, and a bending part disposed between the first region and the second region. A protection layer is disposed on the bending part and a part of the first region adjacent to the bending part. A polarization layer is disposed on the first region and is separated from the protection layer. An adhesive layer covers a separation space between the polarization layer and the protection layer to block (e.g., close off) the separation space from an outside.

The adhesive layer may further include a portion disposed on the polarization layer and a portion disposed on the protection layer.

The adhesive layer may be formed continuously from the polarization layer to the protection layer.

A cover window disposed on the polarization layer may be further included, and the adhesive layer may be disposed between the cover window and the polarization layer.

A cover window disposed on the polarization layer and a protection film disposed on the cover window may be further included, and the adhesive layer may be disposed between the protection film and the cover window.

The protection layer may further include a portion disposed on a portion of the second region adjacent to the bending part.

The protection layer may include a curing type of resin.

In a bending state, the first region and the second region may overlap and face each other.

The first region may include at least one deformation part that can be deformed.

A display device includes a display panel including a first region, a second region, and a bending part disposed between the first region and the second region. A protection layer is disposed on the bending part and on a part of the first region adjacent to the bending part. A polarization layer is disposed on the first region and is separated from the protection layer. A first adhesive layer is disposed between the display panel and the polarization layer. A second adhesive layer is disposed on the polarization layer. A separation space between the polarization layer and the protection layer is surrounded (e.g., fully enclosed) by a combination of the display panel, the second adhesive layer, the polarization layer, and the first adhesive layer.

A display device includes a flexible display panel. A protection layer covers a bent part of the flexible display panel. A polarization layer is disposed on a portion of the flexible display panel that is not covered by the protection layer. An adhesive layer covers the polarization layer and overlaps an end of the protection layer. A separation space is disposed between the protection layer, on a first side thereof, and the polarization layer, on a second side thereof.

The adhesive layer may hermetically seal the separation space from an outside.

The polarization layer may be contacted by the adhesive layer on a top surface thereof and the adhesive layer might not contact the polarization layer on a side surface thereof.

The adhesive layer may be a first adhesive layer and a second adhesive layer may be disposed between the polarization layer and the flexible display panel.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

The present invention will be described more fully hereinafter with reference to the accompanying drawings, in which embodiments of the invention are shown. As those skilled in the art would realize, the described embodiments may be modified in various different ways, all without departing from the spirit or scope of the present disclosure.

Like reference numerals may designate like elements throughout the figures and specification.

While the relative sizes, positions and angles shown in the figures do represent example embodiments, the present invention is not necessarily limited to the illustrated sizes and thicknesses.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

In addition, in the specification, when referring to "connected to", this does not only mean that two or more constituent elements are directly connected to each other, but also that two or more constituent elements may be indirectly connected, physically connected, and electrically connected through other constituent elements, and it may be included that parts that are substantially integral are connected to each other although referred to by different names depending on the position or function.

First, a display device according to an embodiment of the present disclosure is described with reference to FIG. 1 to FIG. 5.

Figure 1:
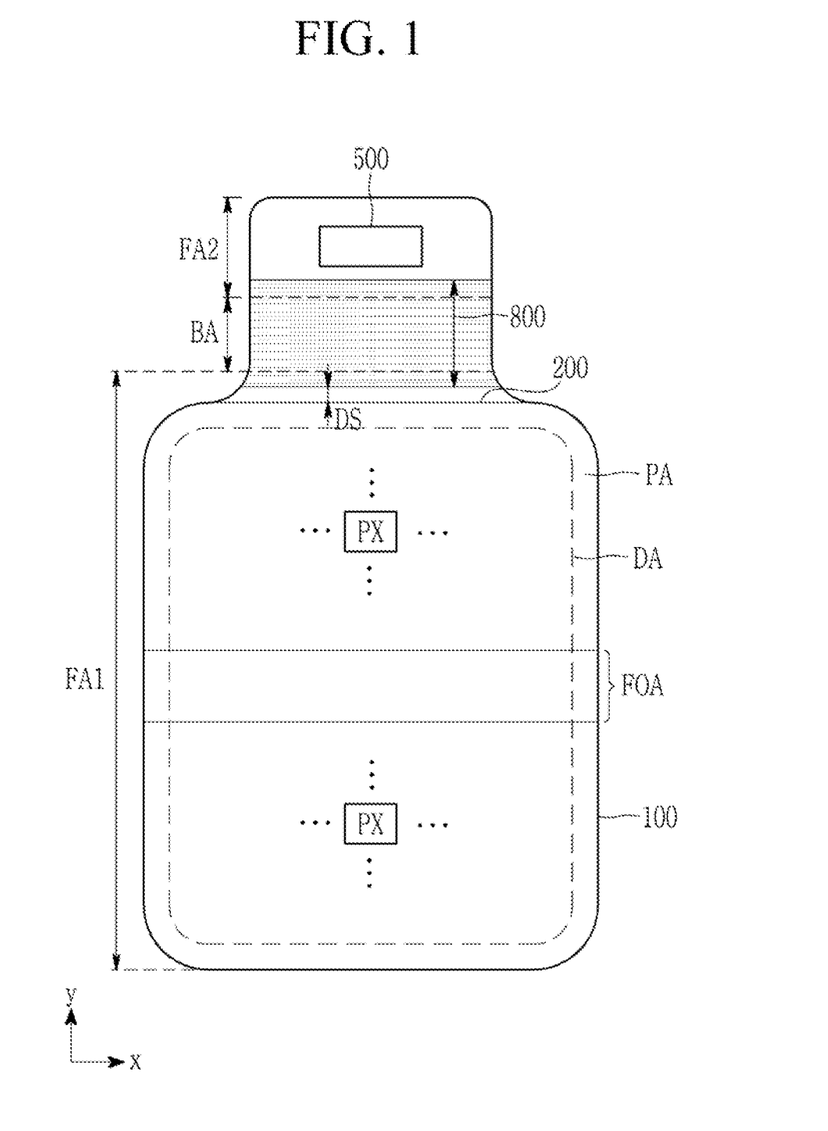
FIG. 1 is a top plan view of an unfolded state of a bending part of a display device according to an embodiment of the present disclosure.
Figure 2:
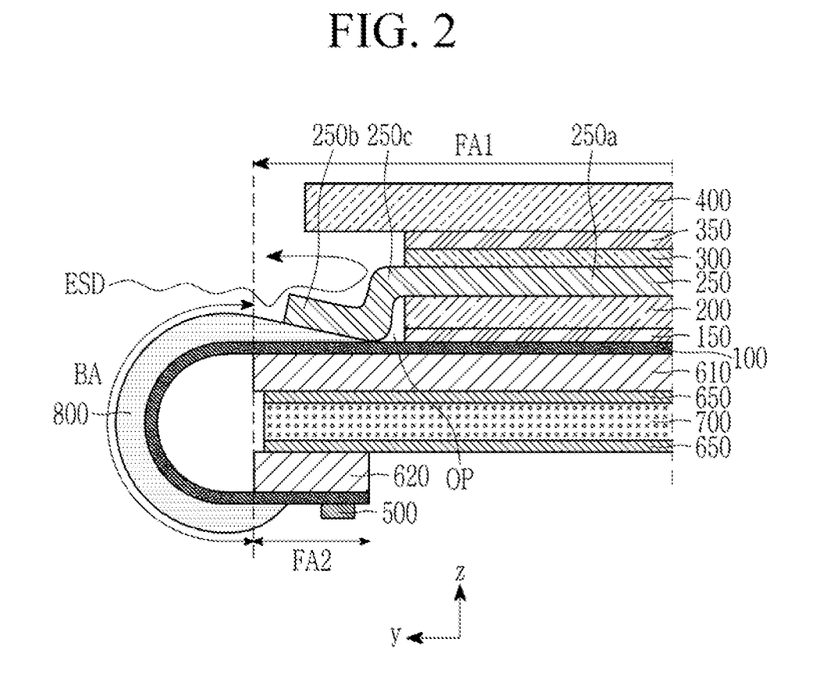
FIG. 2 is a cross-sectional view of a bent state of a bending part of a display device according to an embodiment of the present disclosure.
Figure 3:
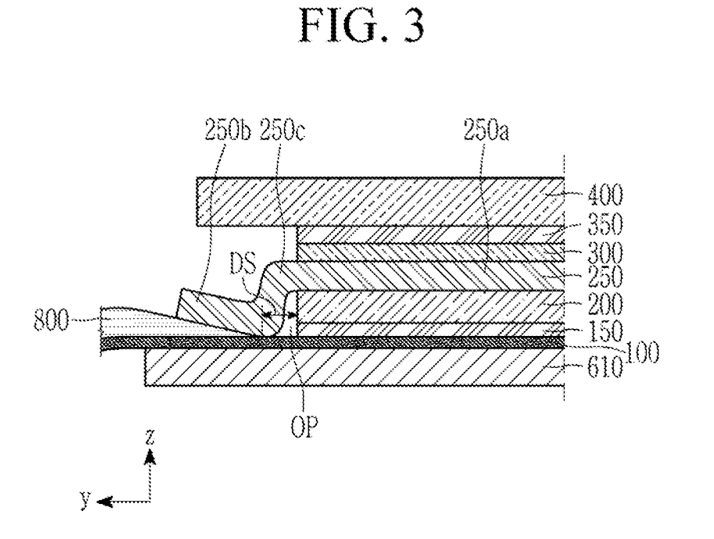
FIG. 3 is an enlarged cross-sectional view of a part of a display device shown in FIG. 2.

FIG. 1 is a top plan view of an unfolded state of a bending part of a display device according to an embodiment of the present disclosure, FIG. 2 is a cross-sectional view of a bent state of a bending part of a display device according to an embodiment of the present disclosure, and FIG. 3 is an enlarged cross-sectional view of a part of a display device shown in FIG. 2.

Referring to FIG. 1, a display device, according to an embodiment of the present disclosure, includes a display panel 100.

The display panel 100 includes a display part DA capable of displaying an image and a peripheral part PA disposed around the display part DA. The peripheral part PA may be a non-display part. The peripheral part PA may at least partially surround the display part DA.

The display part DA may include a plurality of pixels PX, with each pixel being a unit for displaying an image, and a plurality of signal lines such as a gate line and a data line electrically connected to the pixels PX.

The display panel 100 includes a bending part BA, and a first region FA1 and a second region FA2 disposed on opposite sides of the bending part BA.

The display part DA is disposed in the first region FA1. The second region FA2 may be disposed in the peripheral part PA, and the driving part 500 may be disposed in the second region FA2. The driving part 500 may be in a form of a chip on film (COF) or a printed circuit board (PCB), and may drive a display device by supplying a driving signal to the display part DA.

The display panel 100 may be bent in the bending part BA. The bending part BA may be bent about an axis extending in the x direction. In the state that the display panel 100 is bent, the first region FA1 and the second region FA2 may be overlapped and may face in a z direction perpendicular to an xy plane direction as shown in FIG. 2. In the following, referring to the upper part means the z direction shown in FIG. 2.

Referring to FIG. 1 and FIG. 2, a display device, according to an embodiment of the present disclosure, includes a protection layer 800 formed on an upper surface, which is one surface of the display panel 100, and overlapping the bending part BA and some regions of the first region FA1 therearound.

Referring to FIG. 2, when the bending part BA of the display panel 100 is bent, the protection layer 800 may be disposed on a continuous plane at the outer surface of the bending part BA, the upper surface of the first region FA1, and the outer surface of the bending part BA among the surfaces of the second region FA2. One end of the protection layer 800 and the edge thereof are disposed on the first region FA1 of the display panel 100 adjacent to the bending part BA, and the other end of the protection layer 800 and the edge thereof are disposed on the second region FA2 of the display panel 100 adjacent to the bending part BA.

The protection layer 800 covers at least a part of the boundary between the bending part BA and the first region FA1 and the boundary between the bending part BA and the second region FA2.

Referring to FIG. 1 and FIG. 2, the display device, according to an embodiment of the present disclosure, may include a polarization layer 200 overlapping the first region FA1 of the display panel 100 on the xy plane. Referring to FIG. 2, the polarization layer 200 may be disposed at the upper part of the display panel 100.

The polarization layer 200 may reduce the reflection of external light incident on the upper part of the display panel 100. When the external light passes through the polarization layer 200 and is reflected from the display panel 100 and then passes through the polarization layer 200 again, the phase of the external light changes. Therefore, the phase of the reflected light and the phase of the external light entering the polarization layer 200 are different, so that destructive interference may occur between the reflected light and the external light.

Referring to FIG. 1, the first region FA1 may include at least one deformation part FOA in which the display panel 100 may be deformed. For example, in the case of the foldable display device, the deformation part FOA may be a folding part where the display device may be bent and folded. In this case, the first region FA1 other than the deformation part FOA may be a non-folding part that is not deformed. The deformation part FOA may be folded about an axis extending in the x direction.

The pixel PX may also be disposed in the deformation part FOA.

Based on this deformation part FOA, the display part DA may be divided into two or more regions. FIG. 1 shows an example in which the display part DA is divided into two regions based on one deformation part FOA.

The stacked structure of the display device in the bent state is described with reference to FIG. 2 and FIG. 3.

The polarization layer 200 is disposed on the first region FA1 of the display panel 100. An adhesive layer 150 may be disposed between the polarization layer 200 and the display panel 100.

A touch part capable of detecting a touch may be further included between the display panel 100 and the polarization layer 200, or the display panel 100 may include a touch part.

A cover window 300 may be disposed on the polarization layer 200. An adhesive layer 250 may be disposed between the cover window 300 and the polarization layer 200.

The cover window 300 may include glass and/or a polymer resin.

At least one protection film 400 may be disposed on the cover window 300. An adhesive layer 350 may be disposed between the cover window 300 and the protection film 400.

The protection film 400 may include at least one among polymer resins such as polyethylene terephthalate (PET), poly(butylene terephthalate) (PBT), polycarbonate (PC), polyethylene naphthalate (PEN), polystyrene (PS), polymethyl methacrylate (PMMA), polyvinyl chloride (PVC), polyethersulfone (PES), polypropylene (PP), and/or polyamide (PA).

In addition, another film or layer may be disposed on the polarization layer 200, and an adhesive layer may be interposed between adjacent layers or films.

Adhesive layers 150, 250, and 350 may be optically transparent adhesive layers and may include a material having a smaller modulus than that of the polarization layer 200 and the cover window 300. For example, the adhesive layers 150, 250, and 350 may include an optically clear adhesive (OCA), an optically clear resin (OCR), or a pressure sensitive adhesive (PSA). For example, the adhesive layers 150, 250, and 350 include, for example, a polymer resin such as an acryl-based material, a silicon-based material, rubber, polyurethane, vinyl acetate, an epoxy resin, and styrene-butadiene-styrene (SBS).

The protection layer 800 disposed on the bending part BA raises a neutral plane when the bending part BA is bent, thereby reducing a tensile or compressive stress applied to the bending part BA, thereby reducing damage to wiring and the like of the bending part BA.

The protection layer 800 may include a resin of a UV curing type (e.g., a UV curing or UV cured resign), but the material is not necessarily limited thereto. For example, the protection layer 800 may include organic materials such as a polyimide, an epoxy-based resin, an acryl-based resin, polyester, a photoresist, a polyacryl-based resin, a polyimide-based resin, a polyamide-based resin, a siloxane-based resin, or a resin such as silicone, urethane, or thermoplastic polyurethane.

On the first region FA1 of the display panel 100, one end of the polarization layer 200 and one end of the protection layer 800 facing each other are spaced apart by a predetermined distance DS. The predetermined distance DS may vary depending on the flexible characteristic of the display device.

As described above, when the display device is bent in the deformation part FOA, a slide phenomenon in which the adjacent layers stacked with the adhesive layer in between, such as the display panel 100, the polarization layer 200, the cover window 300, and the protection film 400, are slipped along the surface may occur. For example, if the polarization layer 200 and the protection layer 800, which are disposed directly with the adhesive layer 150 in between on the display panel 100, are not spaced apart from each other by a sufficient distance, when the display device is deformed, the polarization layer 200 slipped for the display panel 100 collides with one end of the protection layer 800, and a stress is applied toward the display panel 100, which may cause cracks in the display panel 100.

However, according to the present embodiment of the present disclosure, since the predetermined distance DS between one end of the polarization layer 200 and one facing end of the protection layer 800 is spaced apart by the predetermined distance DS in consideration of the degree of the deformation of the display device, the polarization layer 200 slipped for the display panel 100 when the display device is deformed does not collide with one end of the protection layer 800, thereby defects such as the cracks in the display panel 100 may be prevented.

According to one embodiment of the present disclosure, at least one adhesive layer disposed on the polarization layer 200 is further extended from the edge of the layer directly in contact with the top and bottom of the adhesive layer, and as shown in FIG. 2, includes a portion disposed on one end of the protection layer 800 on the first region FA1 and the portion adjacent thereto, and a portion covering the separation space OP between the polarization layer 200 and the protection layer 800 and disposed thereon.

For example, at least one adhesive layer disposed on the polarization layer 200 includes a first portion 250a disposed on the polarization layer 200 in the xy plane view and overlapping the polarization layer 200, a second portion 250b covering the portion of the protection layer 800 on the first region FA1, and a third portion 250c disposed between the first portion 250a and the second portion 250b and covering the separation space OP between the polarization layer 200 and the protection layer 800 and disposed thereon. The first portion 250a, the second portion 250b, and the third portion 250c are continuously formed i.e., they are all part of a singular continuous structure.

The separation space OP between the polarization layer 200 and the protection layer 800 may be blocked or closed from the outside by at least one adhesive layer extending over the separation space OP.

The volume of the separation space OP is greater than 0, and may be surrounded by a combination of the display panel 100, the polarization layer 200, the adhesive layer 150, and the adhesive layer 250. Alternatively, the separation space OP may be surrounded by a combination of the display panel 100, the polarization layer 200, the adhesive layer 150, the adhesive layer 250, and a portion of the end of the protection layer 800.

For example, referring to FIG. 2, the adhesive layer 250 directly disposed on the polarization layer 200 includes a first portion 250a further extended from the edge of the polarization layer 200 and the cover window 300 directly in contact at the top and bottom and disposed on the polarization layer 200, a second portion 250b disposed on the protection layer 800 on the first region FA1, and a third portion 250c disposed on the separation space OP between the polarization layer 200 and the protection layer 800.

According to this, as shown in FIG. 2, static electricity ESD that may be introduced from the outside cannot penetrate into the separation space OP between the polarization layer 200 and the protection layer 800, so it is possible to prevent the display panel 100 from being affected by the static electricity and thereby prevent defects from occurring.

The protection member 610 may be disposed on the lower surface of the first region FA1 of the display panel 100 in a state where the bending part BA is bent (e.g., the rear surface of the first region FA1). In addition, the protection member 620 may be disposed on the upper surface of the second region FA2 of the display panel 100 (e.g., the rear surface of the second region FA2). An adhesive layer may be disposed between the display panel 100 and the protection members 610 and 620. The protection members 610 and 620 may serve to support and protect the display panel 100.

An opening between the protection members 610 and 620 may be disposed on the lower surface of the bending part BA. For example, the protection members 610 and 620 are removed/omitted from in the region overlapping the bending part BA, so that the display panel 100 may be more easily bent in the bending part BA.

The protection members 610 and 620 may include polymer resins such as an acryl-based compound, polyethylene terephthalate (PET), a polyimide (PI), and the like.

In the state where the bending part BA of the display panel 100 is bent, a spacer 700 may be disposed between the protection member 610 disposed on the rear surface of the first region FA1 and the protection member 620 disposed on the rear surface of the second region FA2. The spacer 700 may support the display panel 100 in the state where the bending part BA is bent.

The spacer 700 may be attached to each of the protection members 610 and 620 via the adhesive layer 650.

Now, the structure of the display part DA and the bending part BA of the display panel 100 according to an embodiment of the present disclosure is described with reference to FIG. 4 and FIG. 5 along with FIG. 1 to FIG. 3.

Figure 4:
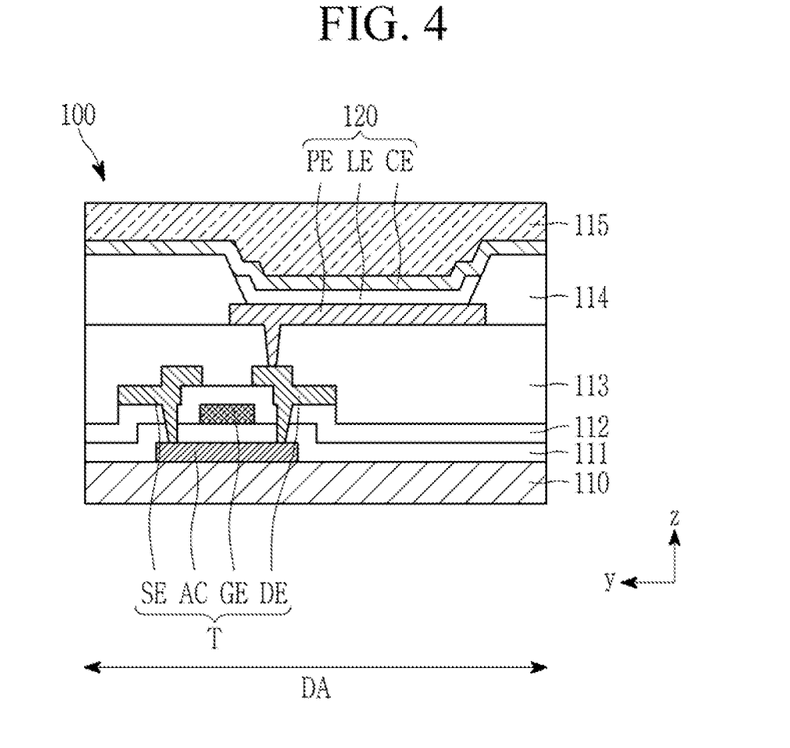
FIG. 4 is a cross-sectional view of a display area of a display device according to an embodiment of the present disclosure.

FIG. 4 is a cross-sectional view of a display area of a display device according to an embodiment of the present disclosure.

The display panel 100 according to an embodiment of the present disclosure may include a substrate 110 and a plurality of layers stacked on the substrate 110.

The substrate 110 may be a flexible substrate including a plastic material such as a polyimide (PI).

A semiconductor layer AC of a transistor T may be disposed on the substrate 110, and a gate insulating layer 111 may be disposed thereon. The semiconductor layer AC may include a source region, a drain region, and a channel region disposed between the source and drain regions. The semiconductor layer AC may include polysilicon, amorphous silicon, and/or an oxide semiconductor. The gate insulating layer 111 may include an inorganic insulating material such as a silicon oxide or a silicon nitride.

A gate conductive layer including a gate electrode GE of the transistor T may be disposed on the gate insulating layer 111. The gate conductive layer may include, for example, a metal or a metal alloy such as molybdenum (Mo), copper (Cu), aluminum (Al), silver (Ag), chromium (Cr), tantalum (Ta), or titanium (Ti).

A first insulating layer 112 may be disposed on the gate conductive layer. The first insulating layer 112 may include an inorganic insulating material.

A data conductive layer including a source electrode SE and a drain electrode DE of the transistor T may be disposed on the first insulating layer 112. The source electrode SE and the drain electrode DE may be electrically connected to the source region and the drain region of the semiconductor layer AC through holes of the first insulating layer 112 and the gate insulating layer 111, respectively.

The data conductive layer may include a metal or metal alloy such as, for example, aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni).

A second insulating layer 113 may be disposed on the data conductive layer. The second insulating layer 113 may include an organic insulating material.

A pixel electrode PE may be disposed on the second insulating layer 113. The pixel electrode PE may be electrically connected to the drain electrode DE of the transistor T through a hole of the second insulating layer 113 to receive a data signal.

A third insulating layer 114 may be disposed on the second insulating layer 113 and the pixel electrode PE. The third insulating layer 114 may have an opening overlapping the pixel electrode PE. The third insulating layer 114 may include an organic insulating material.

An emission layer LE is disposed in the opening of the third insulating layer 114 on the pixel electrode PE, and a common electrode CE is disposed on the emission layer LE.

The pixel electrode PE, the emission layer LE, and the common electrode CE together constitute a light emitting diode (LED) 120. The pixel electrode PE may be an anode of the light emitting diode (LED) 120, and the common electrode CE may be a cathode of the light emitting diode (LED) 120.

An encapsulation layer 115 that seals and protects the light emitting diode (LED) 120 may be disposed on the common electrode CE. According to an embodiment of the present disclosure, an encapsulation substrate may be disposed instead of the encapsulation layer 115.

The display device may include a built-in touch sensor, and a touch sensor layer may be further disposed on the encapsulation layer 115.

Figure 5:
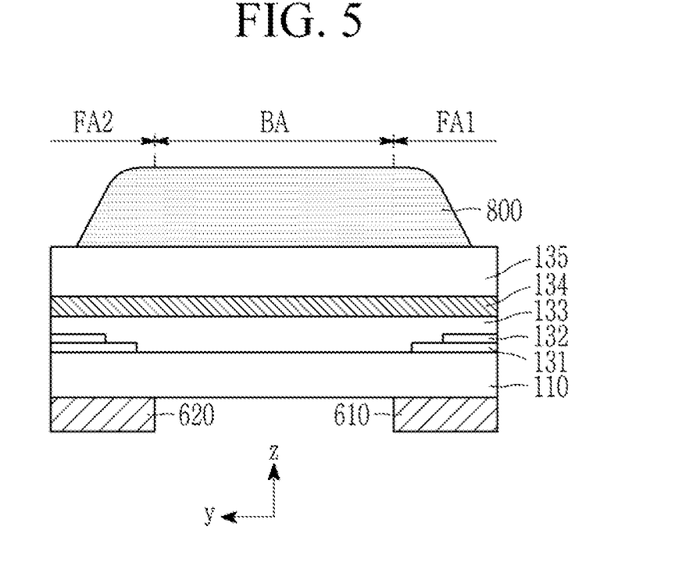
FIG. 5 is a cross-sectional view of a bending part and a periphery part of a display device according to an embodiment of the present disclosure.

FIG. 5 is a cross-sectional view of a bending part and a periphery thereof of a display device according to an embodiment of the present disclosure.

The bending part BA of the display panel 100, according to an embodiment of the present disclosure, includes a plurality of layers and overlaps the protection layer 800. The plurality of layers include a substrate 110, at least one wiring layer 134, and at least one insulating layer (133 and 135).

A plurality of layers of the bending part BA includes a layer in which at least a portion of the layer disposed in the first region FA1 or the second region FA2 extends. For example, the bending part BA may include the substrate 110 and at least one of the second insulating layer 113 and the third insulating layer 114 described in FIG. 4.

The insulating layer 135 may include at least one of the second insulating layer 113 and the third insulating layer 114 described in FIG. 4.

The insulating layer 133 disposed below or above the insulating layer 135 may be an organic insulating layer not disposed in (e.g., omitted from) the first region FA1 or the second region FA2. FIG. 5 shows an example in which the insulating layer 133 is disposed below the insulating layer 135, but the present disclosure is not necessarily limited thereto.

The wiring layer 134 may be disposed between two adjacent insulating layers 133 and 135. The wiring layer 134 may include a signal line electrically connecting the driving part 500 and the display part DA disposed in the first region FA1. The signal line of the wiring layer 134 crosses the bending part BA and is connected to the data line through a pad part to supply a data signal.

The wiring layer 134 may be disposed on the same layer as the gate conductive layer or the data conductive layer disposed in the first region FA1 or the second region FA2, and may include a same material as the gate conductive layer or the data conductive layer.

As shown in FIG. 5, the inorganic insulating layers 131 and 132, disposed in the first region FA1 or the second region FA2, may include an end portion disposed near the bending part BA without extending to the bending part BA. The inorganic insulating layers 131 and 132 may include, for example, the gate insulating layer 111 and the first insulating layer 112 described above.

On the other hand, an inorganic insulating layer having a thickness and shape such that cracks do not occur even when bending the bending part BA may be disposed in the bending part BA.

An opening between the protection members 610 and 620 may be disposed on the lower surface of the bending part BA.

Each layer shown in FIG. 4 and FIG. 5 may be composed of a single layer or a plurality of layers.

The display device according to an embodiment of the present disclosure will be described with reference to FIG. 6 along with the drawings described above.

Figure 6:
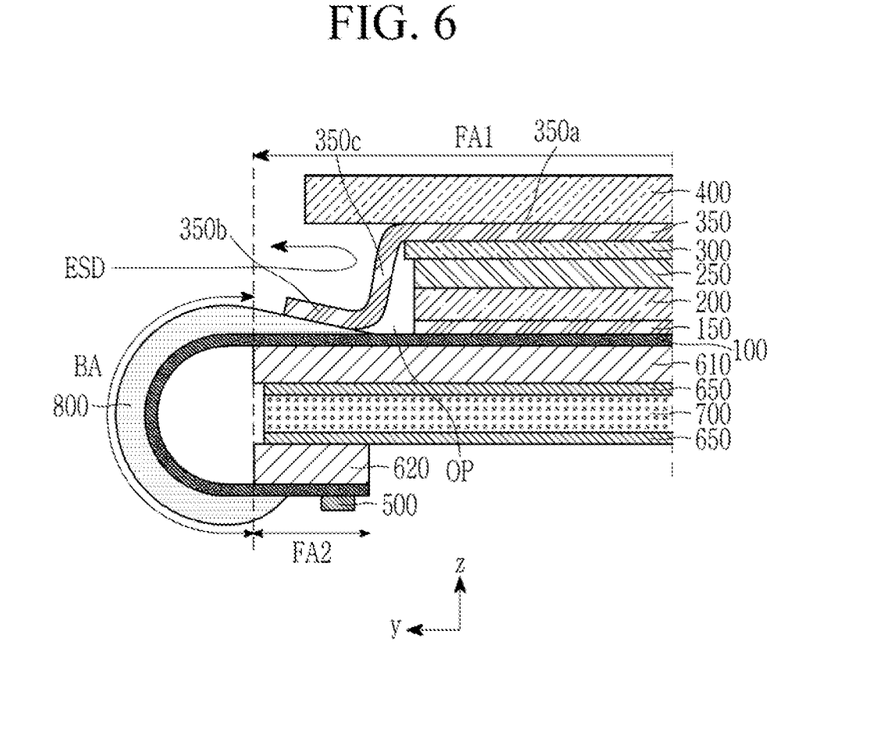
FIG. 6 is a cross-sectional view of a bent state of a display device according to an embodiment of the present disclosure.

FIG. 6 is a cross-sectional view in a state in which a bending part of a display device according to an embodiment of the present disclosure is bent.

The display device according to one embodiment of the present disclosure is mostly the same as the display device according to the above-described embodiment of the present disclosure, however the adhesive layer 350 disposed between the cover window 300 and the protection film 400 extends further from the edge of the polarization layer 200 and the cover window 300 that are in direct contact at the upper and lower parts, so that the end portion of the protection layer 800 on the first region FA1 of the display panel 100 may be covered. For example, the adhesive layer 350 may include a first portion 350a disposed on the cover window 300, a second portion 350b disposed on the protection layer 800 over the first region FA1, and a third portion 350c on the separation space OP between the polarization layer 200 and the protection layer 800.

According to this, as shown in FIG. 6, the static electricity ESD that may be introduced from the outside cannot penetrate into the separation space OP between the polarization layer 200 and the protection layer 800, so it is possible to prevent the display panel 100 from being affected by the static electricity and thereby preventing defects.

A plurality of adhesive layers on the polarization layer 200, for example, the adhesive layer 250 and the adhesive layer 350, may both extend to the top of the protection layer 800 on the first region FA1 to cover the separation space OP.

While example embodiments of the present disclosure have been described in connection with the figures, it is to be understood that the invention is not necessarily limited to the disclosed embodiments.

What is claimed is:

1. A display device, comprising:
a display panel including a first region, a second region, and a bending part disposed between the first region and the second region, the display panel including a substrate;
a protection layer disposed on the bending part and on a portion of the first region proximate to the bending part;
a polarization layer disposed on the first region and spaced apart from the protection layer; and
an adhesive layer disposed on the polarization layer,
wherein the adhesive layer includes a first portion overlapping the polarization layer, a second portion covering a part of the protection layer on the first region, and a third portion disposed between the first portion and the second portion and disposed on a separation space between the polarization layer and the protection layer, and
wherein the first portion overlaps an upper surface of the polarization layer extending parallel to an upper surface of the substrate, and the third portion is continuously formed from the first portion.

2. The display device of claim 1, wherein
the separation space is sealed from an outside by the adhesive layer.

3. The display device of claim 2, wherein
the first portion, the second portion, and the third portion are part of a single continuous structure.

4. The display device of claim 3, further comprising:
a cover window disposed on the polarization layer; and
a first additional adhesive layer disposed between the cover window and the polarization layer.

5. The display device of claim 4, further comprising:
a protection film disposed on the cover window; and
a second additional adhesive layer disposed between the protection film and the cover window.

6. The display device of claim 5, wherein
the first additional adhesive layer and/or the second additional adhesive layer form a part of the adhesive layer.

7. The display device of claim 3, wherein
the protection layer further includes a portion disposed on a part of the second region that is proximate to the bending part.

8. The display device of claim 3, wherein
the protection layer includes a curing type of resin.

9. The display device of claim 1, wherein
in a bending state, the first region and the second region overlap and face each other.

10. The display device of claim 1, wherein
the first region includes at least one folding part that is foldable.

11. A display device, comprising:
a display panel including a first region, a second region, and a bending part disposed between the first region and the second region;
a protection layer disposed on the bending part and on a part of the first region adjacent to the bending part;
a polarization layer disposed on the first region and spaced apart from the protection layer; and an adhesive layer covering a separation space that is an open space between the polarization layer and the protection layer to seal the separation space from an outside.

12. The display device of claim 11, wherein the adhesive layer further includes a first portion disposed on the polarization layer and a second portion disposed on the protection layer.

13. The display device of claim 12, wherein the adhesive layer is a single continuous structure from the polarization layer to the protection layer.

14. The display device of claim 13, further comprising a cover window disposed on the polarization layer, wherein the adhesive layer is disposed between the cover window and the polarization layer.

15. The display device of claim 13, further comprising:
a cover window disposed on the polarization layer; and
a protection film disposed on the cover window,
wherein the adhesive layer is disposed between the protection film and the cover window.

16. The display device of claim 13, wherein of the protection layer is disposed on a portion of the second region adjacent to the bending part.

17. The display device of claim 13, wherein the protection layer includes a curing type of resin.

18. The display device of claim 11, wherein in a bending state, the first region and the second region overlap and face each other.

19. The display device of claim 11, wherein the first region includes at least one deformation part that is deformable.

20. A display device, comprising:
a display panel including a first region, a second region, and a bending part disposed between the first region and the second region;
a protection layer disposed on the bending part and on a part of the first region that is proximate to the bending part;
a polarization layer disposed on the first region and spaced apart from the protection layer;
a first adhesive layer disposed between the display panel and the polarization layer; and
a second adhesive layer disposed on the polarization layer,
wherein a separation space between the polarization layer and the protection layer is an open space that is fully surrounded by a combination of the display panel, the second adhesive layer, the polarization layer, and the first adhesive layer.

21. A display device, comprising:
a flexible display panel;
a protection layer covering a bent part of the flexible display panel;
a polarization layer disposed on a portion of the flexible display panel that is not covered by the protection layer; and
an adhesive layer covering the polarization layer and overlapping an end of the protection layer,
wherein a separation space is disposed between the protection layer, on a first side thereof, and the polarization layer, on a second side thereof, and
wherein the adhesive layer extends continuously to overlap the end of the protection layer and the separation space between the protection layer and the polarization layer.

22. The display device of claim 21, wherein the adhesive layer hermetically seals the separation space from an outside.

23. The display device of claim 21, wherein the polarization layer is contacted by the adhesive layer on a top surface thereof and the adhesive layer does not contact the polarization layer on a side surface thereof.

24. The display device of claim 21, wherein the adhesive layer is a first adhesive layer and a second adhesive layer is disposed between the polarization layer and the flexible display panel.

* * * * *